(12) United States Patent
Urakawa

(10) Patent No.: US 6,462,995 B2
(45) Date of Patent: *Oct. 8, 2002

(54) SEMICONDUCTOR MEMORY DEVICE CAPABLE OF RECOVERING DEFECTIVE BIT AND A SYSTEM HAVING THE SAME SEMICONDUCTOR MEMORY DEVICE

(75) Inventor: Yukihiro Urakawa, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/975,149

(22) Filed: Oct. 12, 2001

(65) Prior Publication Data

US 2002/0015341 A1 Feb. 7, 2002

Related U.S. Application Data

(60) Continuation of application No. 09/860,911, filed on May 21, 2001, now Pat. No. 6,324,106, which is a division of application No. 09/523,177, filed on Mar. 10, 2000, now Pat. No. 6,246,617.

(30) Foreign Application Priority Data

Mar. 11, 1999 (JP) ............................................. 11-65531

(51) Int. Cl.[7] ................................................. G11C 7/00
(52) U.S. Cl. ..................................... 365/200; 365/225.7
(58) Field of Search ............................... 365/200, 225.7

(56) References Cited

U.S. PATENT DOCUMENTS 5,272,671 A * 12/1993 Kudo et al. ................. 365/200

* cited by examiner

Primary Examiner—Trong Phan
(74) Attorney, Agent, or Firm—Oblon Spivak, McClelland, Maier & Neustadt, P.C.

(57) ABSTRACT

The present invention provides a semiconductor memory device capable of simplifying a test process for a memory circuit containing a nonvolatile memory while reducing an overhead of its chip area and a system incorporating the same semiconductor memory device. This semiconductor memory device comprises a proper memory cell array, a redundant memory cell with which the defective memory cell in the proper memory cell array is to be replaced, a register for holding defect information of the defective memory cell detected in the proper memory cell array temporarily; a control circuit for replacing the defective memory cell with the redundant memory cell according to the defect information of the memory cell held in the register, a redundant program array which is an expansion of the same memory cell as the proper memory cell array while sharing a column with the proper memory cell array so as to store defect information in the same column as the defective memory cell, a writing circuit for writing defect information held in the register into the redundant program array, and a reading circuit for reading the defect information stored in the redundant program array into the register.

20 Claims, 12 Drawing Sheets

SEMICONDUCTOR MEMORY DEVICE CAPABLE OF RECOVERING DEFECTIVE BIT AND A SYSTEM HAVING THE SAME SEMICONDUCTOR MEMORY DEVICE

This application is a continuation of prior application Ser. No. 09/860,911, filed May 21, 2001 (now U.S. Pat. No. 6,324,106 B2, issued Nov. 27, 2001), which was a division of application Ser. No. 09/523,177, filed on Mar. 10, 2000 (now U.S. Pat. No. 6,246,617 B1, issued Jun. 12, 2001).

BACKGROUND OF THE INVENTION

1. Field of the Invention

The present invention relates to a semiconductor memory device capable of recovering defective bit and a system having the same semiconductor memory device. More particularly, the present invention relates to a semiconductor memory device having built-in self-test function in which a test function is incorporated in a chip so as to reduce overhead of its chip area and simplify processing steps.

2. Description of the Background Art

With recently increased scale of LSI, system LSI containing a large capacity memory such as SRAM, DRAM and flash memory has appeared. Generally, these memory cells use stricter processing rules than other logic area for high integration and their critical area (area designed based on minimum processing rule) is enlarged. Therefore, a yield rate of the memory cell is lower than other logic portions.

To solve this problem, the memory that is incorporated in system as well as general purpose memory is provided with a defective memory recovery means such as a redundancy circuit and employs a method for increasing the yield rate of the system LSI.

FIG. 1 shows an example of configuration of memory redundancy circuit. Referring to FIG. 1, a proper memory array 100 is composed of m rows x n columns and a row decoder 101 selects a desired row (i-th row). As a result, all memory cells connected to the i-th row are activated. Each column is connected to n-bit bus line through a reading circuit 102 and a writing circuit 103. A content of the memory cell is accessed by the reading circuit 102 and writing circuit 103 of the memory cell connected to the selected i-th column.

In such a configuration, to enable recovery of the defective bit of, for example, 1 bit, a redundant bit column 104 is disposed in the vicinity of the proper memory array 100.

Usually, a reading circuit 102 and writing circuit 103 equivalent to the reading circuit and writing circuit of the proper memory array 100 are connected to this redundancy bit column 104 in redundant condition.

If there is a defective bit in the j-th row and k-th column, all memory cells of the k-th column in both the reading circuit and writing circuit are inhibited to use. Then, the memory cell column of the (k+1)-th column, reading circuit 102 and writing circuit 103 are connected to the k-th bit bus line. Next, a memory cell column of the (k+2)-th column, reading circuit and writing circuit are connected to the bus line of the (k+1)-th bit. That is, the connection to the bus line is shifted by 1 bit. A memory cell column of a redundant bit column 104, reading circuit and writing circuit are connected to the bus line of the n-th bit. This recovery method for redundancy is called shift redundancy. This shift redundancy is a very effective method for a memory having a large bus width like a memory incorporated in system LSI. As a result, a proper function of the memory is never lost even if a defective bit of 1 bit exists.

Therefore, even if there is found a defective bit, it can be recovered so that the yield rate is improved remarkably.

FIG. 2 shows a structure of a program circuit 105 (shown in FIG. 1) for achieving the aforementioned bit shift. In FIG. 2, this program circuit 105 is disposed at each bit column.

Usually, both inputs of logical product (AND) gate 106 are of high level, and the bit column and bus line of the proper memory array 100 are connected to each other corresponding to the same bit column by a multiplexer (MUX) 107.

If the redundancy of a memory cell of the k-th column is achieved, the fuse 108 composed of metallic wiring layer or polysilicon wiring layer corresponding to the k-th column is melted down with the use of laser beam or the like, so that one input of the AND gate 106 becomes low level. Then, the MUX 107 connects the (k+1)-th column of the proper memory array to the bus line of the k-th bit and the output of the AND gate of the k-th column is transmitted to all the AND gates 106 of the upper side. Then, the upper bit MUX after the k-th bit selects the upper bit column and connection is shifted from the k-th column including the defective bit to adjoining (k+1)-th column. Because this shift information is propagated to the program circuits 105 from the k-th bit to the n-th bit through the AND gate 106. Therefore, single defective bit can be repaired by melting of single fuse 108.

However, because the aforementioned redundancy recovery method using the fuse facilitates melting down of the fuse, first, additional processing step such as thinning of the protective film on the fuse is necessary for easy melt down. Second, because the fuse is melted down by laser beam, the fuse layout pattern cannot be decreased in size and further, any active element or wiring layer cannot be disposed in the fuse region. Thus, there is a problem that the overhead of area is increased.

FIG. 3 shows a flowchart of a test process for system LSI including a redundant circuit by BIST (built-inself-test). In this BIST, first, memory test is carried out on the wafer (step S10) and the fuse 108 of a column including the defective bit is melted down (step S11). The memory test is carried out again on the wafer in which connection is shifted (step S12) and die sort by function test is carried out (step S14). Memory test (step S15) in package and final test (step S16) are carried out.

As shown in FIG. 3, the redundancy recovery method using the fuse has such a problem that a post process for melting of the fuse and an additional memory test after the melting of the fuse are necessary. Further, if any defective bit is contained in the memory cell from the beginning, the logical circuit having no redundancy means cannot be tested sufficiently in the first memory test and therefore, additional test must be carried out after the redundancy processing. Therefore, there is another problem that the test cost is increased.

To solve such a problem, the BISR (built-in self-repair) method has been proposed, in which the defective bit is extracted using the aforementioned BIST method and then this defective bit information is memorized in a register so as to realize the melting of the fuse.

FIG. 4 shows an example of a structure of the self-test circuit of the memory using the BIST. Referring to FIG. 4, the BIST comprises an address pattern generator 111 for a test target memory 110, a data pattern generator 112, an expected value generator 113b and a comparator 113 for comparing an expected value attached to the bus of each bit with read out data. Then, the BIST realizes a function of memory tester in a LSI chip so as to determine whether the memory array is acceptable. In the aforementioned, the register is connected to an output of this comparator 113 and a result of determining whether or not the bit is acceptable is stored in this register. This register plays the same role as the aforementioned fuse, so that connection is shifted to adjoining memory cell column without using a memory cell column in which the defective cell exists.

FIG. 5 shows an example of the structure of the BISR. In this BISR circuit, data read out from the memory cell is compared with an expected value and a result of the comparison is stored in the register and bit shift is realized for recovery of the defective bit depending on the storage content. In FIG. 5, the readout data amplified by a sense amplifier (S/A) 114 is compared with the expected value in an exclusive NOR (EX-NOR) gate 115 and this comparison result is held by the register 116. If the comparison result does not coincide, "0" is held by the register 116 and this information is propagated to the upper bit side through the AND gates 117, 118. As a result, the shift to the upper bit is carried out by the MUX 119 as described above, so that the defective bit column is replaced with the redundant bit column.

However, this BISR method of holding information of the defective cell in the register 116 can only maintain the defect information temporarily, different from the melting down of the fuse. Therefore, even if the BISR employs the register, the BISR still needs to employ the fuse at the same time. As a result, regarding the above described problems, it comes only that the memory portion can determine whether or not other logical circuit is acceptable for a chip which may be recovered, before the processing step of meltdown of the fuse. Therefore, even if the BISR is employed, a problem that an additional processing step for introducing the fuse is added and an overhead of the chip area have not been solved.

FIG. 6 shows a flowchart of test procedure of the memory by the BISR. In the final die sort by the function test, first, memory test by the BIST is carried out (step S1a). If a defect is detected (YES in step S1b), if the defect may be recovered (YES at step S1c), the defective bit is replaced with redundant column (step S1d). Then, the function test is carried out (step S1e) and the defective bit is checked again (step S1f), so as to determine whether or not the object memory is acceptable. In the memory test using the BIST, the fuse melting-down step (step S2) and post-test test processing (step S16) are still necessary.

To eliminate the necessity of the fuse completely, it can be considered to hold defect information in the register by carrying out the aforementioned test by BISR each time when the system is started up. However, there is no guarantee that the environment at the time of system startup will not change from the environment at the actual system operation. For example, it can be considered that the temperature in the casing at the time of system startup is low and the temperature increases gradually when the system is operated. If the system is operated for a long time, it is affected by a change in temperature outside the casing. Further, the system power supply may be affected by a change in the ambient temperature, a change with time passage and other operating condition of the system. Therefore, a memory cell having a small operating margin and which manages to pass a test depending on condition at the time of system startup has a possibility that it may induce a fault with changes in voltage/temperature at the time of system operation. If this occurs, the system reliability is damaged remarkably.

Usually, in the shipment test on the LSI, margin test of the operating environment is carried out by changing the operating environment such as high temperature/low temperature, high voltage/low voltage and the like. Because redundancy is achieved by determining whether or not the memory cell is acceptable through these steps, any memory cell having no operating margin from the beginning has been already detected by screening upon shipment. Therefore, even if just the test by the BISR is carried out without melting down the fuse at the time of system startup, no practical performance is achieved.

As described above, in the first redundancy recovery method using the fuse in order to hold defect information, fuse occupied area increases so that the overhead of area also increases, thereby inducing a disadvantage that integration of the memory cell is hampered. Further, a fuse melt-down step and an additional test step after the fuse is melted down are required, so that a large number of time and labor are consumed by such an increase of the processing steps.

On the other hand, with the user of the second method, the defect information is held in a register by carrying out the aforementioned test by the BISR each time the system containing a memory that employs the conventional redundancy recovery method with the fuse is started up. Therefore, the necessity of the fuse is eliminated. In this method, however, there is a fear that the system environment changes between system startup and system operation. Thus, there occurs a following disadvantage that only if the test by BISR is carried out at the time of system startup, a change of the operating environment with a passage of time cannot be taken into account.

SUMMARY OF THE INVENTION

An object of the present invention is to provide a semiconductor memory device capable of simplifying a test process, while reducing an overhead of memory area and maintaining a practical-level accuracy of the memory circuit, by enabling redundancy of a defective bit without use of a fuse in the test of a memory circuit containing a nonvolatile memory, and a system incorporating the same semiconductor memory device.

Another object of the present invention is to provide a semiconductor memory device in which recovery of redundancy of the defective bit is enabled by a fuse formed out of a circuit formation region in the test of a memory circuit without any nonvolatile memory, and a system incorporating the same semiconductor memory device.

To achieve the above object, according to an aspect of the present invention, there is provided a semiconductor memory device for replacing a defective memory cell detected in a test with a redundant memory cell, comprising: a proper memory cell array; a redundant memory cell with which the defective memory cell in the proper memory cell array is to be replaced; a register for holding defect information of the defective memory cell detected in the proper memory cell array temporarily; a control circuit for replacing the defective memory cell with the redundant memory cell according to the defect information of the memory cell held in the register; a redundant program array which is an expansion of the same memory cell as the proper memory cell array while sharing a column with the proper memory cell array so as to store defect information in the same column as the defective memory cell; a writing circuit for writing defect information held in the register into the redundant program array; and a reading circuit for reading the defect information stored in the redundant program array into the register.

Preferably, the proper memory cell array is a nonvolatile memory.

Preferably, the control circuit is composed of a built-in self-repair circuit.

Preferably, the reading circuit reads the defect information stored in the redundant program array at the time of start-up.

According to another aspect of the present invention, there is provided a semiconductor memory device for replacing a defective memory cell detected in a test with a redundant memory cell, comprising: a volatile semiconductor memory, including, a volatile proper memory cell array; a first redundant memory cell with which the defective memory cell in the proper memory cell array is to be replaced; a first register for holding defect information of the defective memory cell in the proper memory cell array temporarily; and a first control circuit for replacing the defective memory cell with the redundant memory cell according to the defect information of the memory cell held in the first register, and a nonvolatile semiconductor memory, including, a nonvolatile proper memory cell array; a second register which is connected to the first register while a holding content is scanned and transferred mutually and defect information of defective volatile memory cell in the proper volatile memory cell array scanned and transferred from the first register is held temporarily; a redundant program array which is an expansion of the same memory cell as the nonvolatile proper memory cell array while sharing a column with the proper nonvolatile memory cell array so as to store the defect information of the defective volatile memory cell held in the second register; a writing circuit for writing the defect information held in the second register in the redundant program array; and a reading circuit for reading defect information stored in the redundant program array into the second register.

Preferably, a holding content of the first and second registers is inputted and outputted by scanning.

Preferably, the nonvolatile semiconductor memory further includes: a second redundant program array for storing defect information of the defective nonvolatile memory cell in the proper nonvolatile memory cell array.

Preferably, the nonvolatile semiconductor memory further includes, a nonvolatile redundant memory cell with which the defective nonvolatile memory cell is to be replaced; and a second control circuit for replacing the defective nonvolatile memory cell with the nonvolatile redundant memory cell according to the defect information held in the second register.

Preferably, the nonvolatile semiconductor memory further includes: a first program array which is an expansion of the same memory cell as the proper nonvolatile memory cell array while sharing a column with the proper nonvolatile memory cell array so as to store defect information which is held in the first register and then transferred to the second register by scanning; and a second program array which is an expansion of the same memory cell as the proper nonvolatile memory cell array while sharing a column with the proper nonvolatile memory cell array so as to store defect information of the nonvolatile memory cell held in the second register.

According to another aspect of the present invention, there is provided a semiconductor memory device for replacing a defective memory cell in a proper memory cell array with a redundant memory cell provided preliminarily based on defect information so as to recover the defective memory cell, comprising: a proper memory cell array; a fuse disposed in a pad formation region out of a circuit formation region for storing defect information of a defective memory cell; and a transfer unit for transferring the defect information of the defective memory cell stored in the fuse to a memory main body in the circuit formation region.

According to another aspect of the present invention, there is provided a built-in self-test semiconductor memory device for replacing a defective memory cell detected in a test with a redundant memory cell, comprising: a test unit for carrying out a test for determining whether or not a memory cell is acceptable each time when the device is started in order to determine whether or not the memory cell is acceptable; a register for holding defect information of a defective memory cell in a memory cell tested by the test unit temporarily; a redundant memory cell with which the defective memory cell it to be replaced;

a control circuit for replacing the defective memory cell with the redundant memory cell according to the defect information held in the register; and a control voltage source for generating a plurality of access voltages which are different mutually for accessing the memory cell and supplying generated each access voltage to the memory cell at the time of the test carried out by the test unit, wherein the test unit carries out the test of the memory cell based on a plurality of different access voltages supplied from the control voltage source to the memory cell and determines whether or not the memory cell is acceptable according to a result of the test.

The memory cell may be composed of static random access memory cell and the access voltage is an activation voltage for a word line of the memory cell.

The memory cell may be composed of dynamic random access memory cell and the access voltage is an activation voltage for a word line of the memory cell and a plate of capacitor constituting the memory cell.

The memory cell may be composed of nonvolatile memory cell and the access voltage is an activation voltage for a writing word line and a reading word line.

According to another aspect of the present invention, there is provided a system incorporating a semiconductor memory device for replacing a defective memory cell detected in a test with a redundant memory cell, comprising: a proper memory cell array; a redundant memory cell with which the defective memory cell in the proper memory cell array is to be replaced; a register for holding defect information of the defective memory cell detected in the proper memory cell array temporarily; a control circuit for replacing the defective memory cell with the redundant memory cell according to the defect information of the memory cell held in the register; a redundant program array which is an expansion of the same memory cell as the proper memory cell array while sharing a column with the proper memory cell array so as to store defect information in the same column as the defective memory cell; a writing circuit for writing defect information held in the register into the redundant program array; a reading circuit for reading the defect information stored in the redundant program array into the register; and a processing unit for carrying out a desired processing using the semiconductor memory device.

According to another aspect of the present invention, there is provided a system incorporating a semiconductor memory device for replacing a defective memory cell detected in a test with a redundant memory cell, comprising: a volatile semiconductor memory, including, a volatile proper memory cell array; a first redundant memory cell with which the defective memory cell in the proper memory cell array is to be replaced; a first register for holding defect information of the defective memory cell in the proper memory cell array temporarily; and a first control circuit for replacing the defective memory cell with the redundant memory cell according to the defect information of the memory cell held in the first register, and a nonvolatile semiconductor memory, including, a nonvolatile proper memory cell array; a second register which is connected to the first register while a holding content is scanned and transferred mutually and defect information of defective volatile memory cell in the proper volatile memory cell array scanned and transferred from the first register is held temporarily; a redundant program array which is an expansion of the same memory cell as the nonvolatile proper memory cell array while sharing a column with the proper nonvolatile memory cell array so as to store the defect information of the defective volatile memory cell held in the second register; a writing circuit for writing the defect information held in the second register in the redundant program array; and a reading circuit for reading defect information stored in the redundant program array into the second register, and a processing unit for carrying out a desired processing using the semiconductor memory device.

Other features and advantages of the present invention will become apparent from the following description taken in conjunction with the accompanying drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The preferred embodiments of the nonvolatile semiconductor memory device capable of recovering a defective bit and a system having the same semiconductor memory device of the present invention will be described in detail with reference to FIGS. 7 to 16.

First Embodiment

Hereinafter, a first embodiment of the present invention will be described in detail with reference to FIG. 7.

The first embodiment of the present invention concerns a nonvolatile semiconductor memory device such as a flash memory, which stores information of the defective bit in a nonvolatile memory in nonvolatile condition. Because the nonvolatile memory uses a valanche breakdown phenomenon for writing, a booster circuit such as a charge pump circuit is required and further, special circuits are necessary for writing and reading. Therefore, if a nonvolatile memory is simply employed instead of the redundancy fuse, a remarkable overhead of area is generated. Therefore, according to the first embodiment, a redundancy array (program array) is added to the proper nonvolatile memory array and this redundancy array region is used with a program for processing redundancy information (that is, defective bit information). According to this method, an access circuit attached to the proper nonvolatile memory array can be used as the access circuit such as the writing circuit and reading circuit, therefore the area overhead is small. Usually, the row decoder of the program array is not open and designed so as to be accessible only at the time of shipment and system startup.

Figure 5:
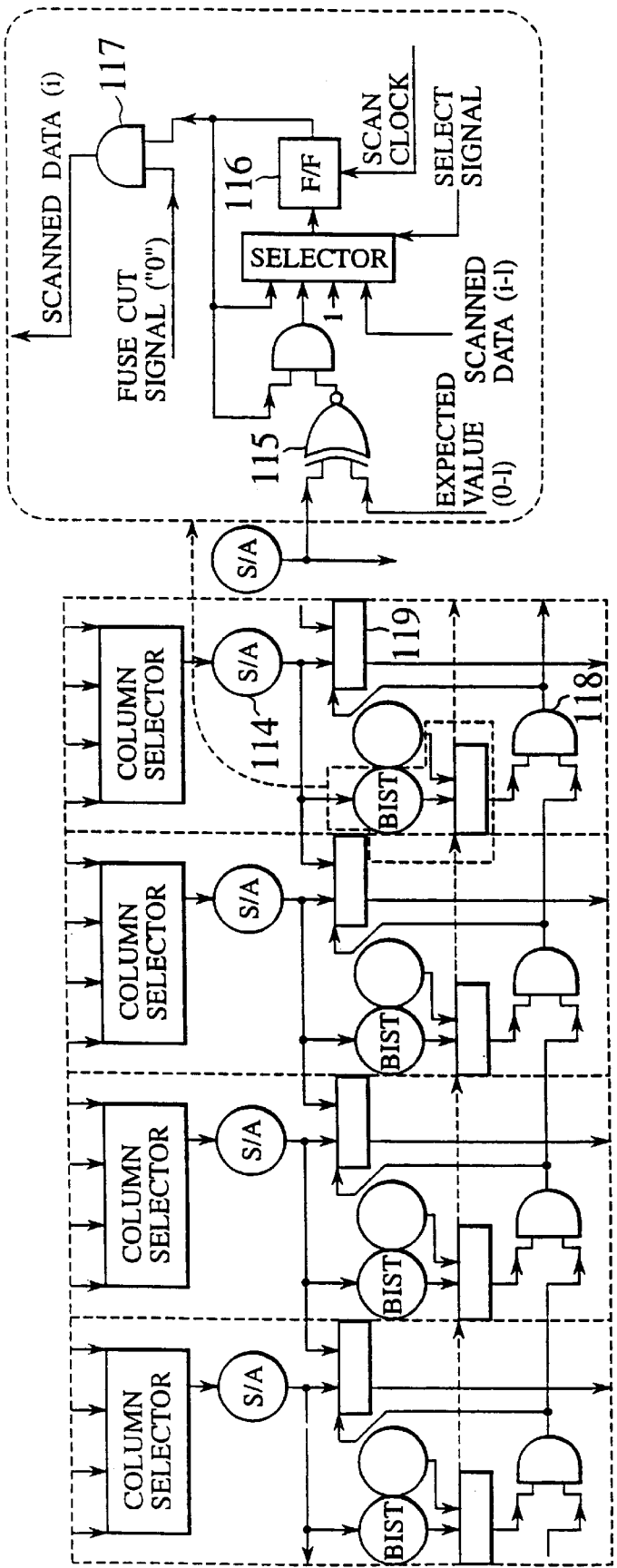
FIG. 5 is a diagram showing an example of a structure of a BISR circuit.
Figure 6:
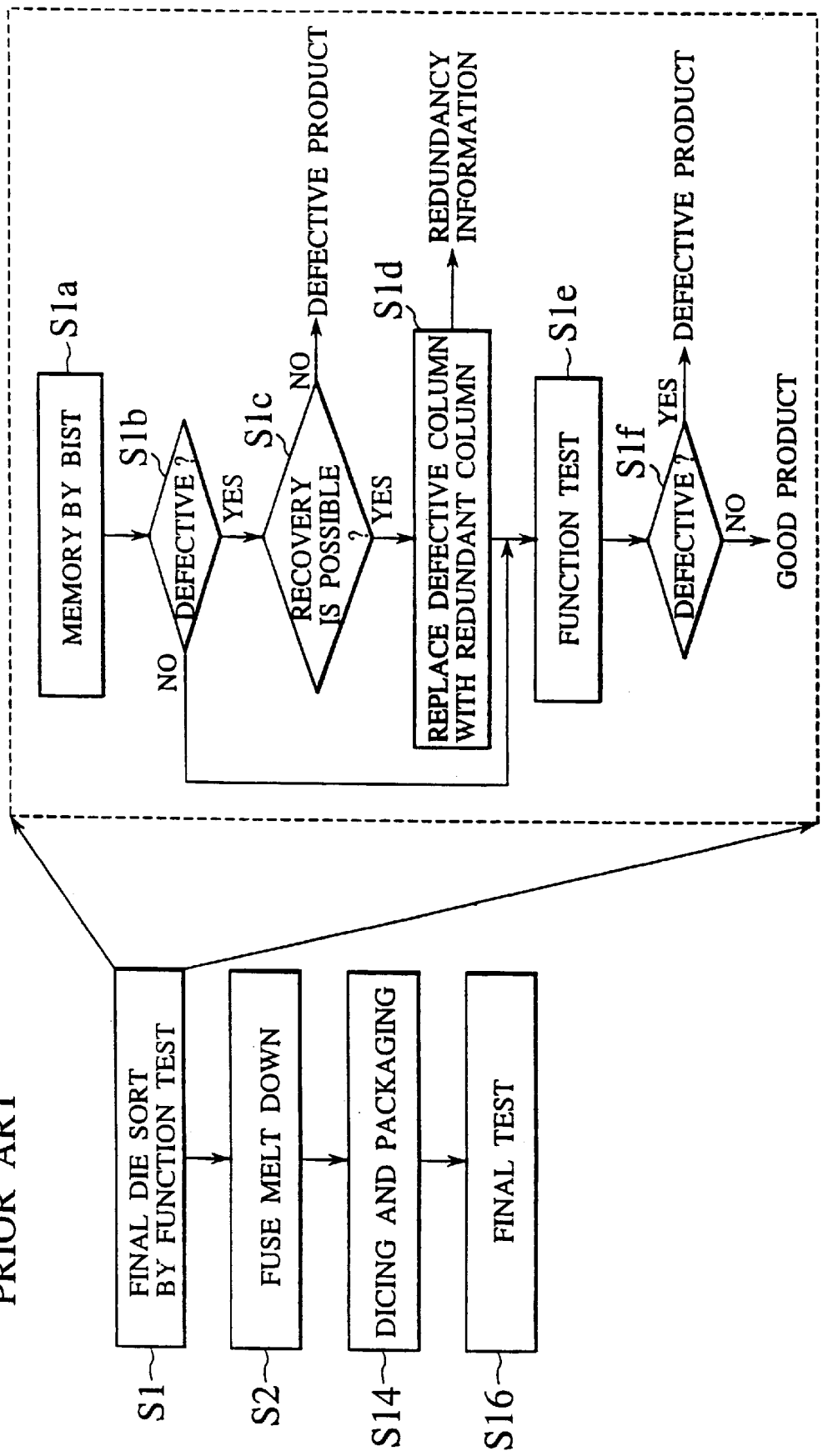
FIG. 6 is a flowchart showing a test process using a conventional BISR circuit.
Figure 7:
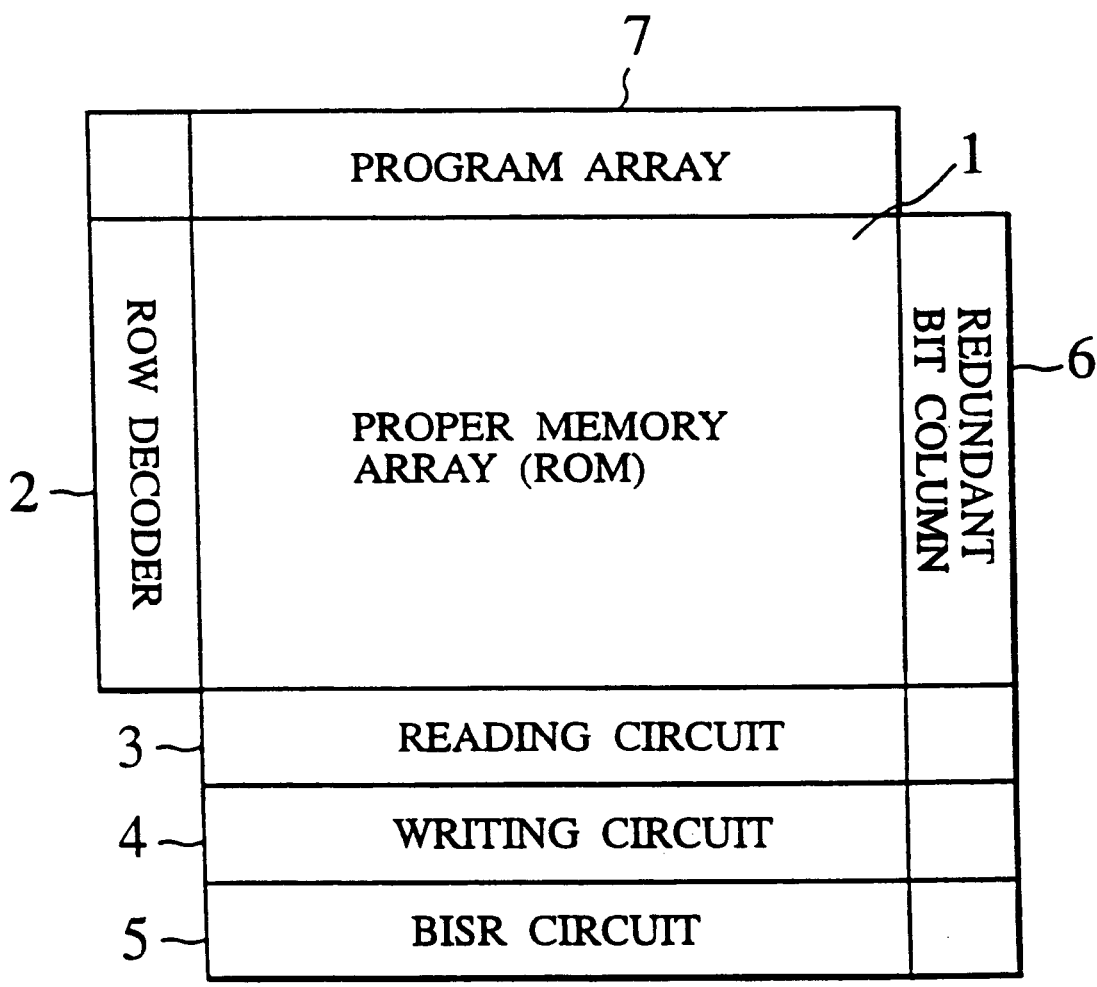
FIG. 7 is a diagram showing a structure of a semiconductor memory device according to a first embodiment of the present invention.

FIG. 7 is a diagram showing a structure of the semiconductor memory device according to a first embodiment of the present invention. FIG. 5 is a diagram showing a detailed structure of the BISR circuit according to the first embodiment.

Figure 1:
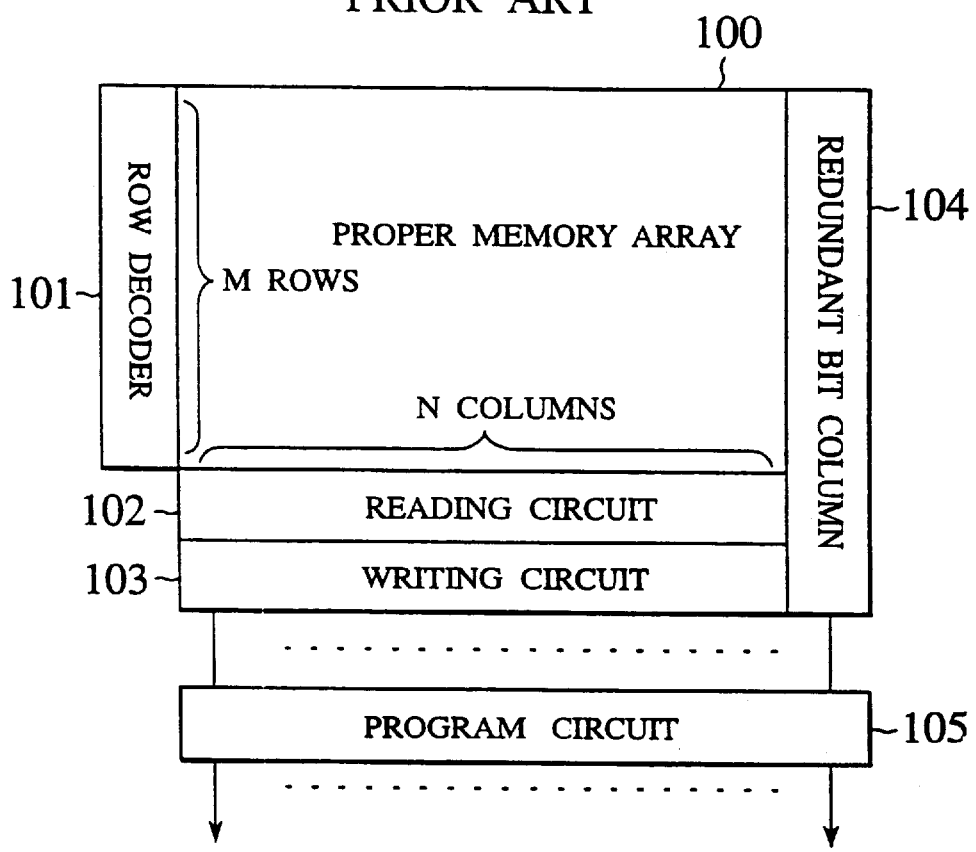
FIG. 1 is a diagram showing a structure of a conventional semiconductor memory device providing redundancy of a memory cell.
Figure 2:
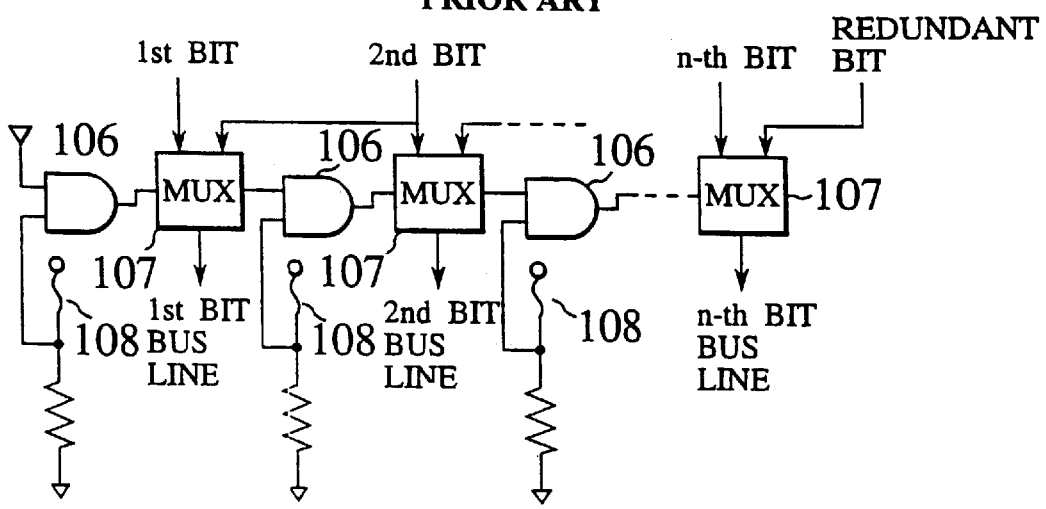
FIG. 2 is a diagram showing a structure of program circuit shown in FIG. 1.
Figure 3:
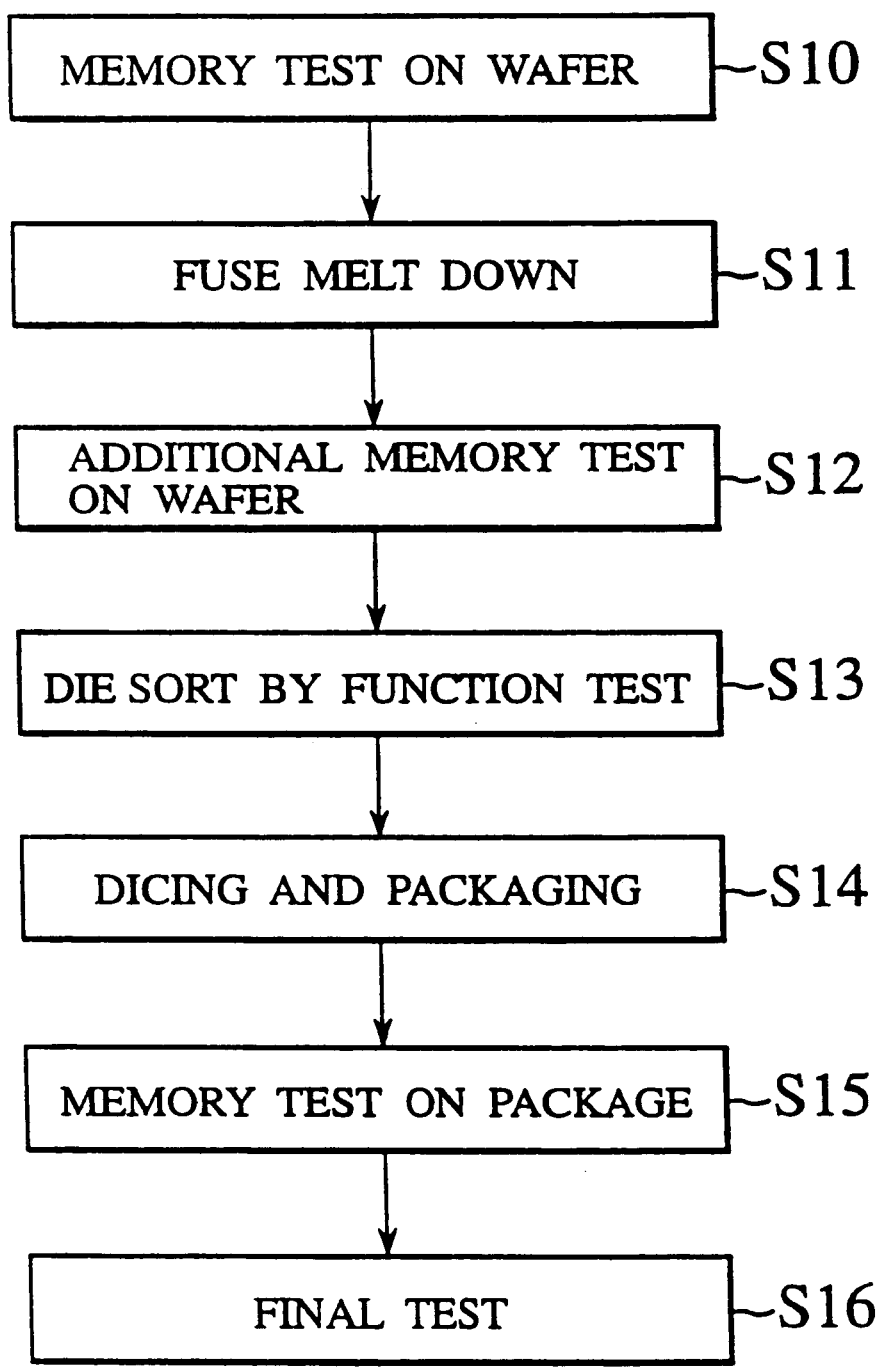
FIG. 3 is a flowchart showing a test process for a conventional semiconductor memory device providing the redundancy of the memory cell.

The nonvolatile semiconductor memory device according to the first embodiment comprises a proper memory (ROM) array 1, a row decoder 2 for selecting an arbitrary row of the proper memory array 1, a reading circuit 3 for reading memory data in a row selected by the row decoder 2, a writing circuit 4 for writing data in a memory cell selected by the row decoder 2, BISR circuit 5 having the structure shown in FIG. 2 excluding a fuse, a redundant bit column 6 to be replaced with the defective bit of a bit in the proper memory array 1 and a program array 7.

Redundancy information having a content held by the register 116 of the BIRS circuit 5 is written (programmed) into the program array 7 by a program enable (PE) signal so that the redundancy information is stored in nonvolatile condition. The stored redundancy information is read out to a register 116.

The reading circuit is provided with a demultiplexer which receives memory data read out from the proper memory array 1 or redundancy information read out from the program array 7 at the time of normal reading operation and providing it to a register 116 of a corresponding bit of a reading buffer or BISR circuit 5 according to PE signal. At the time of normal reading operation, reading data is selected depending on, for example, low-level PE signal and sent to the reading buffer. On the other hand, when redundancy information is outputted from the program array 1, redundancy information read out from the program array 7 depending on the high level PE signal is supplied to the register 116 of a corresponding bit.

The writing circuit 4 is provided with a multiplexer (MUX) for selecting a holding output of the register 116 of a corresponding bit of the BISR circuit 5 or writing data at the normal operation time according to PE signal. At the normal writing operation, writing data is selected according to, for example, low-level PE signal and the selected writing data is written into a memory cell of a selected row through a writing buffer. On the other hand, when the redundancy information is written (programmed) into the program array 1, a content held by the register 116 of a corresponding bit is selected according to high-level PE signal and the selected content is written into a memory cell of the selected program array 7 through the writing buffer.

An operation of the first embodiment having such a structure will be described.

In a test upon shipment, the BISR circuit 5 is started up and a defective bit test is carried out. If there is a defective bit, this redundancy information is held and stored into the register 116 of the BISR circuit 5.

This redundancy information held by the register 16 is selected by the multiplexer of the writing circuit 3 of corresponding bit and then, written into a memory cell of the program array 7 through the writing buffer and bit line so as to be programmed.

After shipment, the redundancy information stored in the program array 7 in nonvolatile condition at the time of system startup is read out by the reading circuit 3 and stored in the register 116 of the BISR circuit 5 of corresponding bit. Then, defective bit is replaced with redundancy bit column 6 based on the redundancy information (information of defective bit) stored in the register.

Therefore, according to the first embodiment, the redundancy of the defective bit can be recovered without using the fuse in order to store information of the defective bit unlike before, so that the aforementioned area overhead and complexity of the processing steps which occur when the fuse is used can be eliminated completely.

Second Embodiment

Next, the semiconductor memory device according to the second embodiment of the present invention will be described about only a different point from the first embodiment in detail with reference to FIGS. 8 and 9.

The second embodiment of the present invention concerns a system including a nonvolatile semiconductor memory device (ROM) and a volatile semiconductor memory device (RAM) for memorizing redundancy information of the volatile semiconductor memory device as well as redundancy information of the nonvolatile memory device into the nonvolatile memory device.

When the volatile semiconductor memory device is started up, the redundancy information is read out from the nonvolatile semiconductor memory device into the volatile semiconductor memory device and redundancy processing of the volatile semiconductor memory device is carried out according to this read redundancy information. Meanwhile, it is permissible to memorize only the redundancy information of the volatile semiconductor memory device in the nonvolatile semiconductor memory device.

Figure 8:
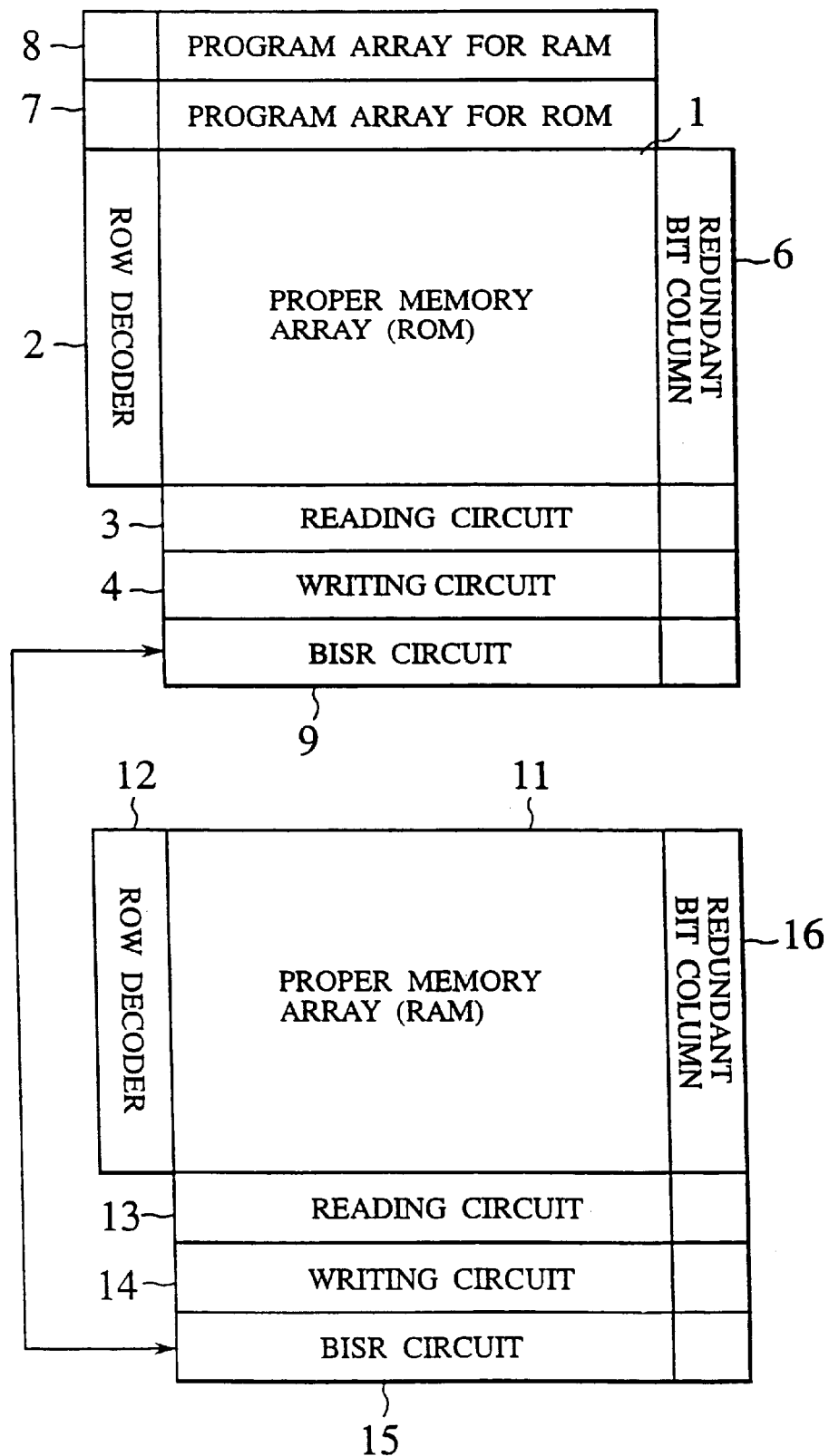
FIG. 8 is a diagram showing a structure of a semiconductor memory device according to a second embodiment of the present invention.

FIG. 8 shows a structure of the semiconductor memory device according to the second embodiment of the present invention.

The semiconductor memory device according to the second embodiment comprises the nonvolatile semiconductor memory device and the volatile semiconductor memory device. The nonvolatile semiconductor memory device according to the second embodiment is provided with a program array 8 for RAM for programming defective information of the volatile semiconductor memory device as compared to the nonvolatile semiconductor memory device of the first embodiment shown in FIG. 7.

Figure 9:
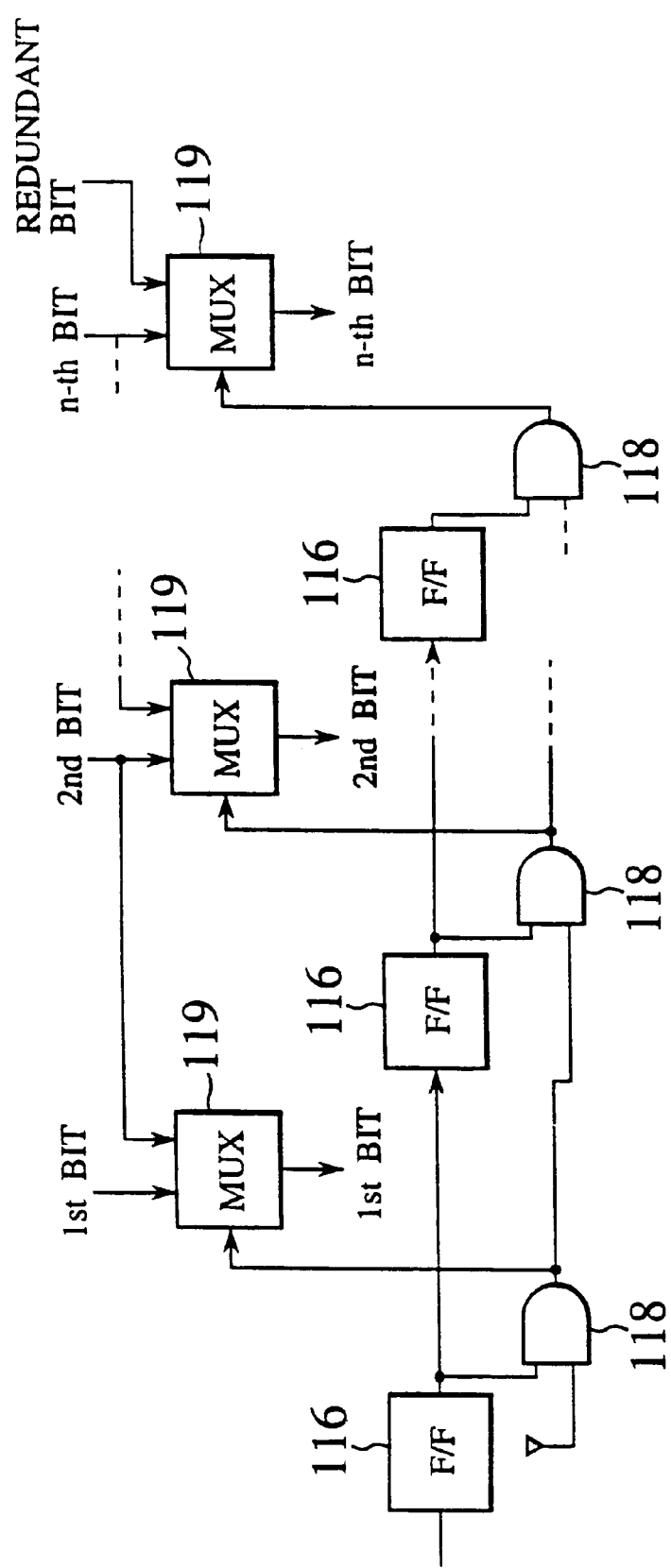
FIG. 9 is a diagram showing an example of a detailed structure of the BISR circuit shown in FIG. 8.

The BISR circuit 9 possessed by the nonvolatile semiconductor memory device is so constructed that the holding content of the register 116 (shown in FIG. 5) of the BISR circuit 5 shown in FIG. 7 can be scanned as shown in FIG. 9.

The volatile semiconductor memory device according to the second embodiment comprises the proper memory (RAM) array 11, the row decoder 12 for selecting an arbitrary row of the proper memory array 11, a reading circuit 13 for reading memory data of a memory cell at a row selected by the row decoder 12, a writing circuit 14 for writing data into a memory cell of a row selected by the row decoder 12, BISR circuit 15, and redundant bit column 16 with which the defective bit of a bit of the proper memory array 11 is to be replaced with.

The BISR circuit 15 is so constructed that the register 116 can be scanned like the BISR circuit 9 and connected to the register 116 which can be scanned in the BISR circuit 9 of the nonvolatile semiconductor memory device. Then holding contents of the registers 116 of both the memory units are scanned and transferred mutually.

For the program array 8 for RAM, it is assumed that the number of bits (number of columns) per row of the volatile semiconductor memory device is N and the number of bits (columns) per row of the nonvolatile semiconductor memory device is M. Then program row of "Int (N/M)" rows have only to be prepared. The program array 7 for ROM and the program array 8 for RAM are selected by ROM program enable signal and RAM program enable signal respectively.

An operation of the second embodiment having such a structure will be described below.

First, the redundancy information (fault information) of the defective bit extracted by the BIST of the volatile semiconductor memory device is stored in the register 116 of the BISR circuit 15.

In a test upon shipment, the redundancy information stored in the register 116 in the BISR circuit 15 of the volatile semiconductor memory device is transmitted to the register 116 of the BISR circuit 9 of the nonvolatile semiconductor memory device, and the redundancy information is written into the program array 8 for RAM through the writing circuit 4. The redundancy information written into the program array 8 is read out at the system startup after shipment and transferred from the register 116 in the BISR circuit 9 of the nonvolatile semiconductor memory device to the register 116 of the BISR circuit 15 of the volatile semiconductor memory device. Then, programming of the redundancy information in the volatile semiconductor memory device is completed.

As described above, according to the second embodiment, redundancy recovery of both the nonvolatile and volatile semiconductor memory devices can be achieved without using the fuse in order to hold the defective bit information.

As a result, all the aforementioned faults which may be caused when the fuse is used can be eliminated.

Third Embodiment

Next, the semiconductor memory device according to the third embodiment of the present invention will be described in detail with reference to FIG. 10.

The third embodiment of the present invention concerns an embodiment containing the fuse for holding information of the defective bit out of a circuit forming region in the volatile semiconductor memory device or a system including the volatile semiconductor memory device but not the nonvolatile semiconductor memory device.

Figure 10:
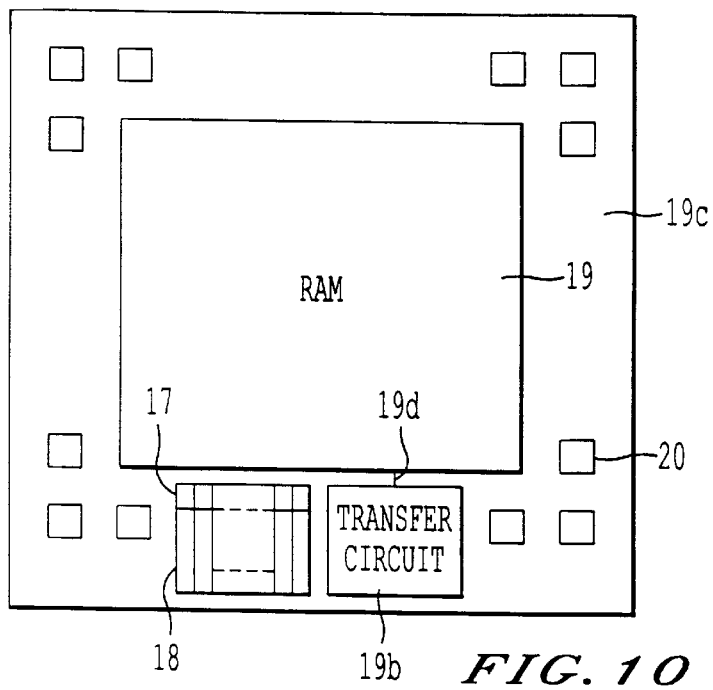
FIG. 10 is a diagram showing a structure of a semiconductor memory device according to a third embodiment of the present invention.

FIG. 10 is a diagram showing a structure of the semiconductor memory device according to the third embodiment.

According to the semiconductor memory device of the third embodiment, in the volatile semiconductor memory device or a system having the volatile semiconductor memory device excluding the nonvolatile semiconductor memory device, a fuse 17 and a register 18 are provided in the pad 20 formation region out of circuit formation region 19. The fuse 18 memorizes the redundancy information and whose number is corresponding to the number of columns of the memory cells. The register 18 determines electrically whether or not the fuse 17 is broken and holds the result and can be scanned.

The redundancy information held by the register 18 is scanned and transmitted to the memory body in the circuit formation region (RAM) 19 by a transfer unit 19b. The circuit formation region 19 and the transfer unit 19b are connected by a single wire 19d. Circuit formation region 19 is disposed on a semiconductor substrate 19c.

According to the third embodiment, the overhead of an occupied area by the circuit formation region of the fuse can be reduced as compared to the conventional example.

If the number of bits in certain column is large, for example, 128 (=$2^7$) bits, it is permissible to express the redundancy information of a bit with the fuse and register of 7 bits and scan-transfer the redundancy information to the register of the BISR circuit by a counting up operation of the counter. With such a structure, the size of the structure of the device can be reduced as compared to a structure including the same numbers of the fuses and registers as the number of the columns.

Fourth Embodiment

Next, the semiconductor memory device according to the fourth embodiment of the present invention will be described in detail with reference to FIGS. 11 to 16.

According to the fourth embodiment, to realize redundancy without incorporating with the fuse, the method for programming redundancy information temporarily using the BISR circuit at the time of system startup is improved, an operating margin of each memory cell at the time of system startup is checked and the defective cell is replaced with redundant cell based on a result of the check.

Figure 11:
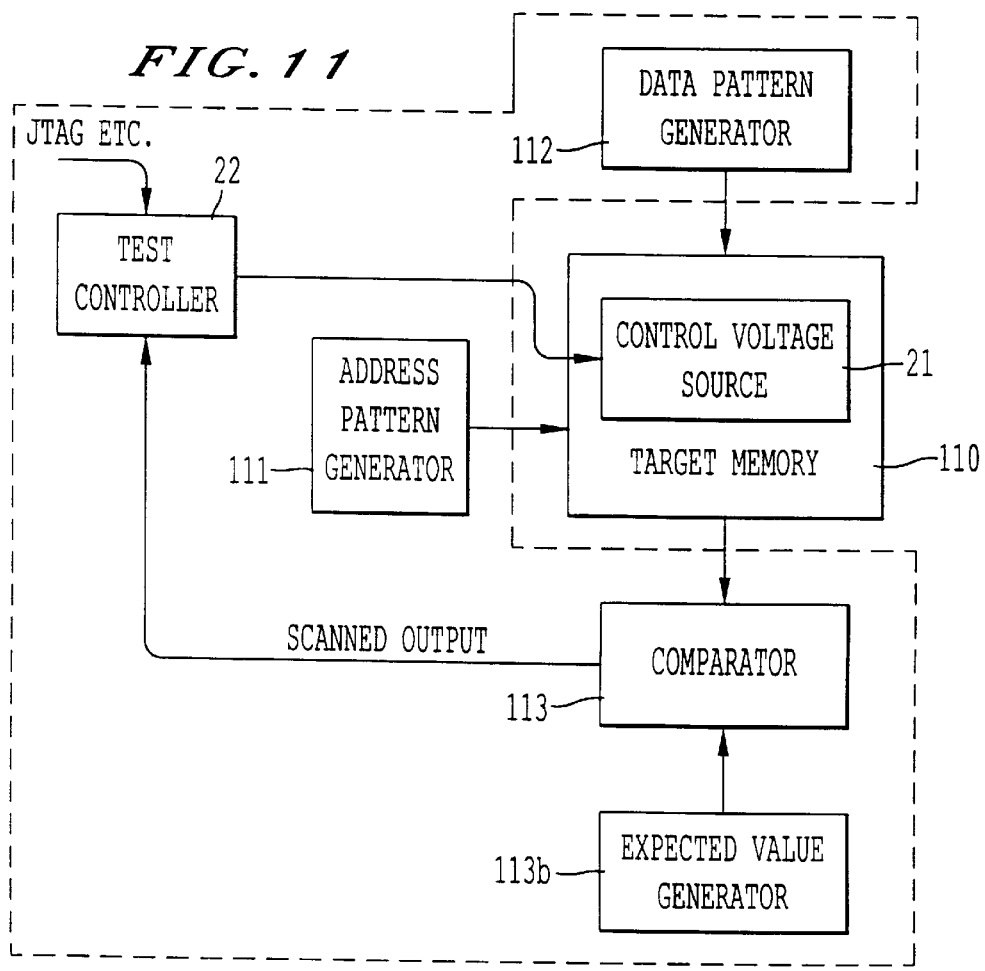
FIG. 11 is a diagram showing a structure of a semiconductor memory device according to a fourth embodiment of the present invention.

FIG. 11 is a diagram showing a structure of the semiconductor memory device according to the fourth embodiment of the present invention.

Figure 4:
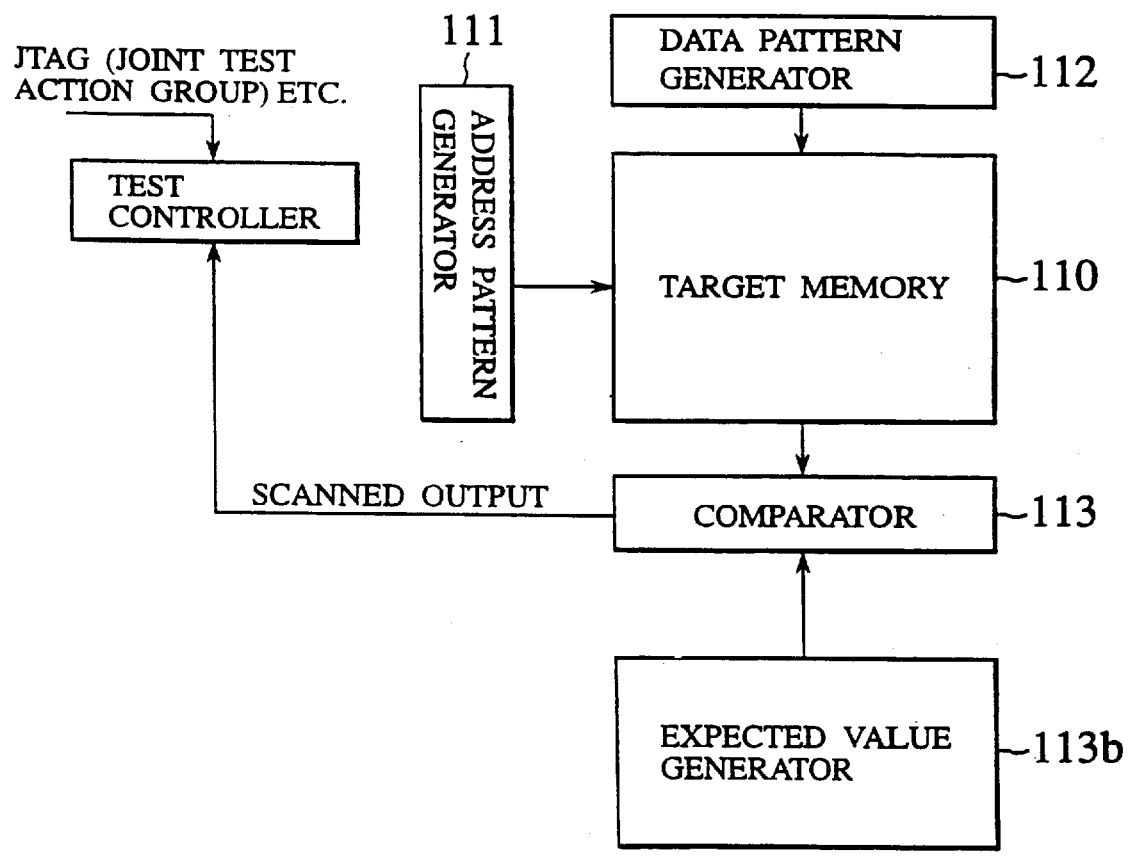
FIG. 4 is a diagram showing an example of a structure of the conventional semiconductor memory carrying out BIST.

The semiconductor memory device according to the fourth embodiment is provided with a control voltage source 21 in addition to the structure shown in FIG. 4 as compared to the structure of the above described BIST/BISR.

An access voltage for checking the operating margin is supplied from this control voltage source 21 to the semiconductor memory device. As a result, the operating margin of the memory device is checked.

The control voltage source 21 is controlled by a test controller 22 of the BIST/BISR (built-in self-repair) circuit 11b, and an output voltage turns to an access voltage for a memory cell. Recently, many semiconductor memory devices use plural different power supply voltages. Such a semiconductor memory device is provided with a limiter circuit for controlling a charge pump or an output voltage of this charge pump to generate plural different voltages. By adjusting the limiter circuit, the access voltage for checking the aforementioned operating margin can be generated with the charge pump easily.

Figure 12:
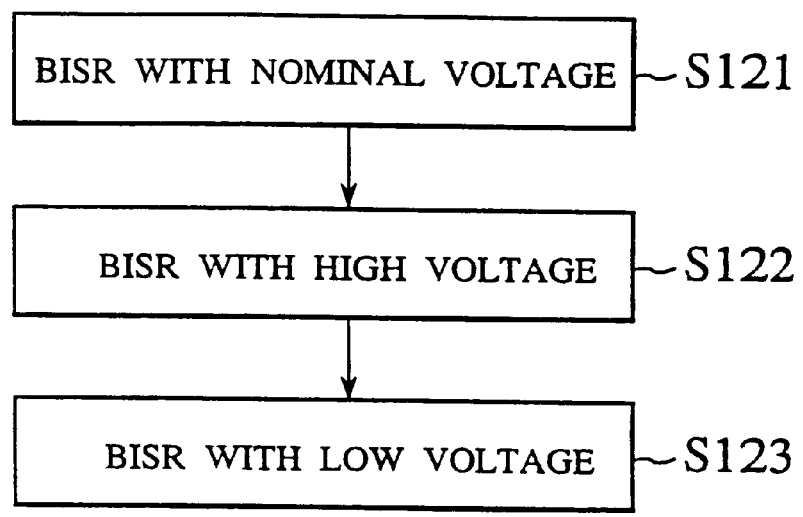
FIG. 12 is a flowchart showing a test procedure for the semiconductor memory device shown in FIG. 11.

FIG. 12 shows an exemplary test flowchart of the BIST/BISR of the fourth embodiment. First, the test controller 22 sets the access voltage to a nominal voltage, generates various test patterns and expected values, sends them to the memory block and determines whether or not each of them is acceptable (step S121). Likewise, the test is carried out at a voltage higher than the nominal voltage by about 10% and a voltage lower by 10%, for example, so as to screen memory cells having a small operating margin (steps S122, S123). If a sufficiently large margin is secured with a high voltage or a low voltage, a margin against a change in temperature due to, for example, continuous operation can be secured.

Because a target memory is tested each time when the system is started up, even if the memory gets into trouble because of operating margin deterioration of the memory cell due to expiration of its reliability duration, it can be repaired. Then the reliability in system level can be improved remarkably. Further, memory check at a practical operating speed can be carried out each time. Consequently, it can be detected beforehand that the memory gets into trouble due to performance deterioration so that the defective cell can be replaced with redundant cell.

Figure 13:
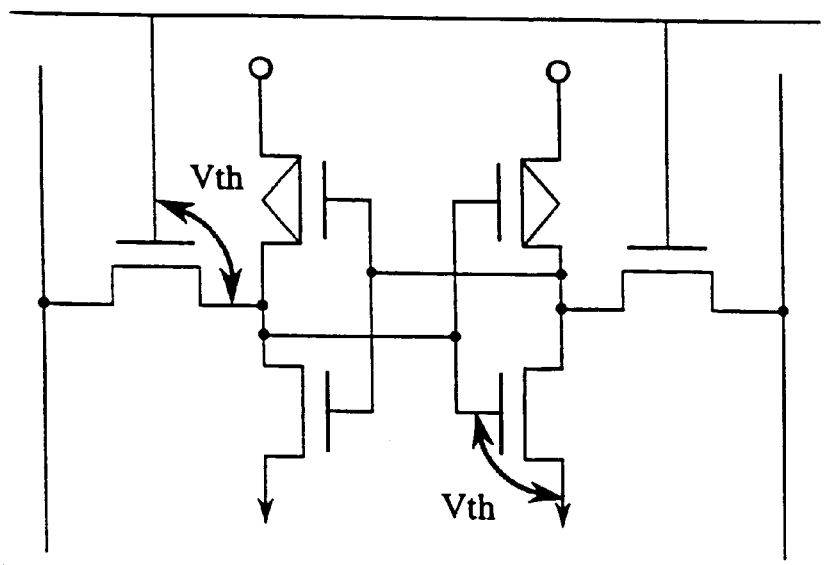
FIG. 13 is a diagram showing an example of structure of a static random access memory (SRAM)

FIG. 13 shows a structure of the SRAM memory cell. In FIG. 13 basically, in case of the SRAM, the operating margin can be checked equivalently at high and low voltages by raising/lowering a word line potential of the memory cell. Alternatively, activation potentials of the word line and grounding line may be controlled. Therefore, by employing the aforementioned control type voltage source 21 as a power supply of each word line, the fourth embodiment may be achieved easily. Recently, the operating voltage has been lowered due to miniaturization of process, therefore, two times the threshold voltage Vth of N-channel FET is absolutely necessary. However, it is difficult to screen the Vth to avoid an operation error due to bit line leak. Therefore, the work line voltage at the normal operation needs to be boosted. By driving the memory cell grounding line to negative potential at the same time when the word line is raised up to level, the memory cell is accessed. Because a power supply generated internally different from an external power supply is employed as a power supply for the work line driving circuit, an overhead for achieving such a function may be decreased to a very small value.

Figure 14:
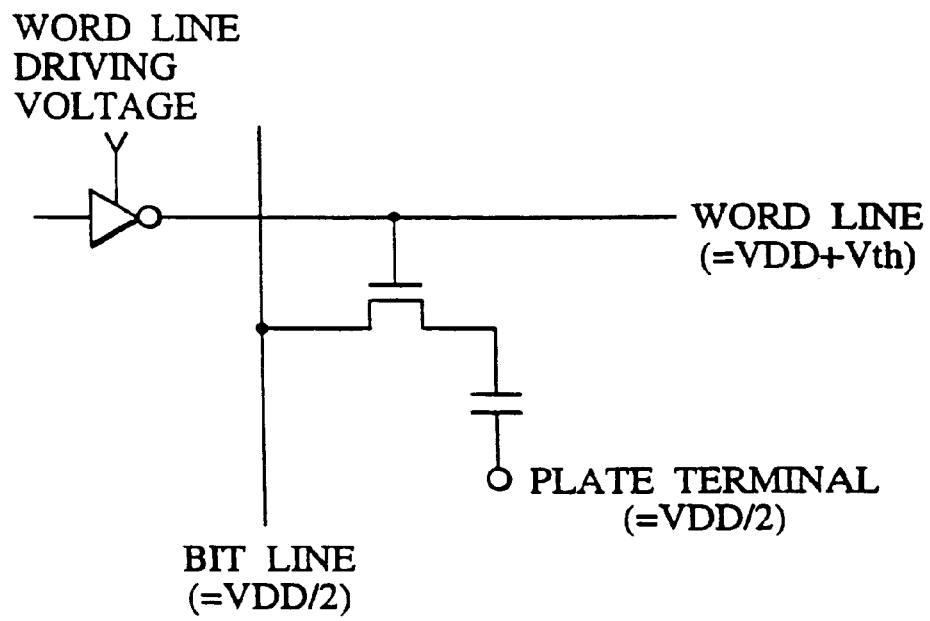
FIG. 14 is a diagram showing an example of dynamic random access memory (DRAM)

FIG. 14 shows an exemplary structure of the DRAM memory cell. In FIG. 14, a change of the operating voltage can be achieved by raising or lowering the work line potential like the SRAM. Further, by changing the bit line potential or a plate potential of a capacitor achieved at half of the power supply voltage (VDD/2), the margin test about an imbalance in "0"/"1" read-out can be achieved. Because these power generating circuits are originally necessary for normal DRAM operation, the overhead is also small in the case of DRAM, so that the fourth embodiment can be achieved.

Figure 15:
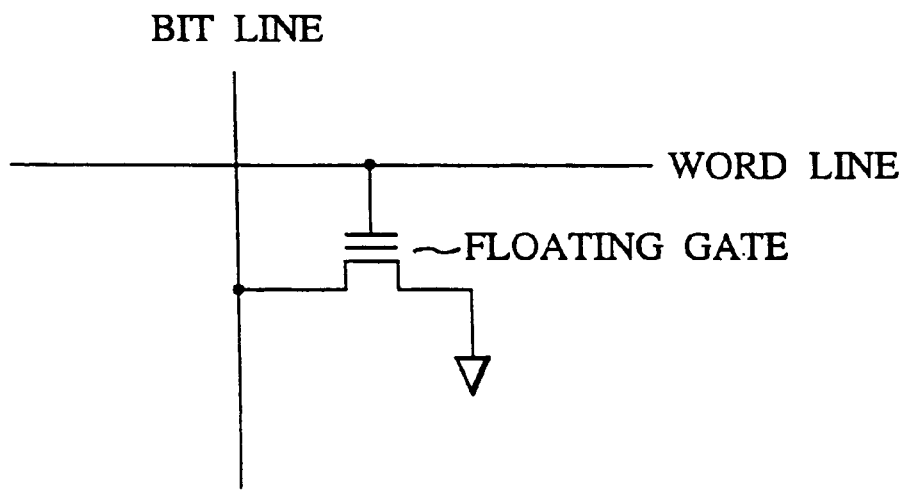
FIG. 15 is a diagram showing an example of nonvolatile memory cell.
Figure 16:
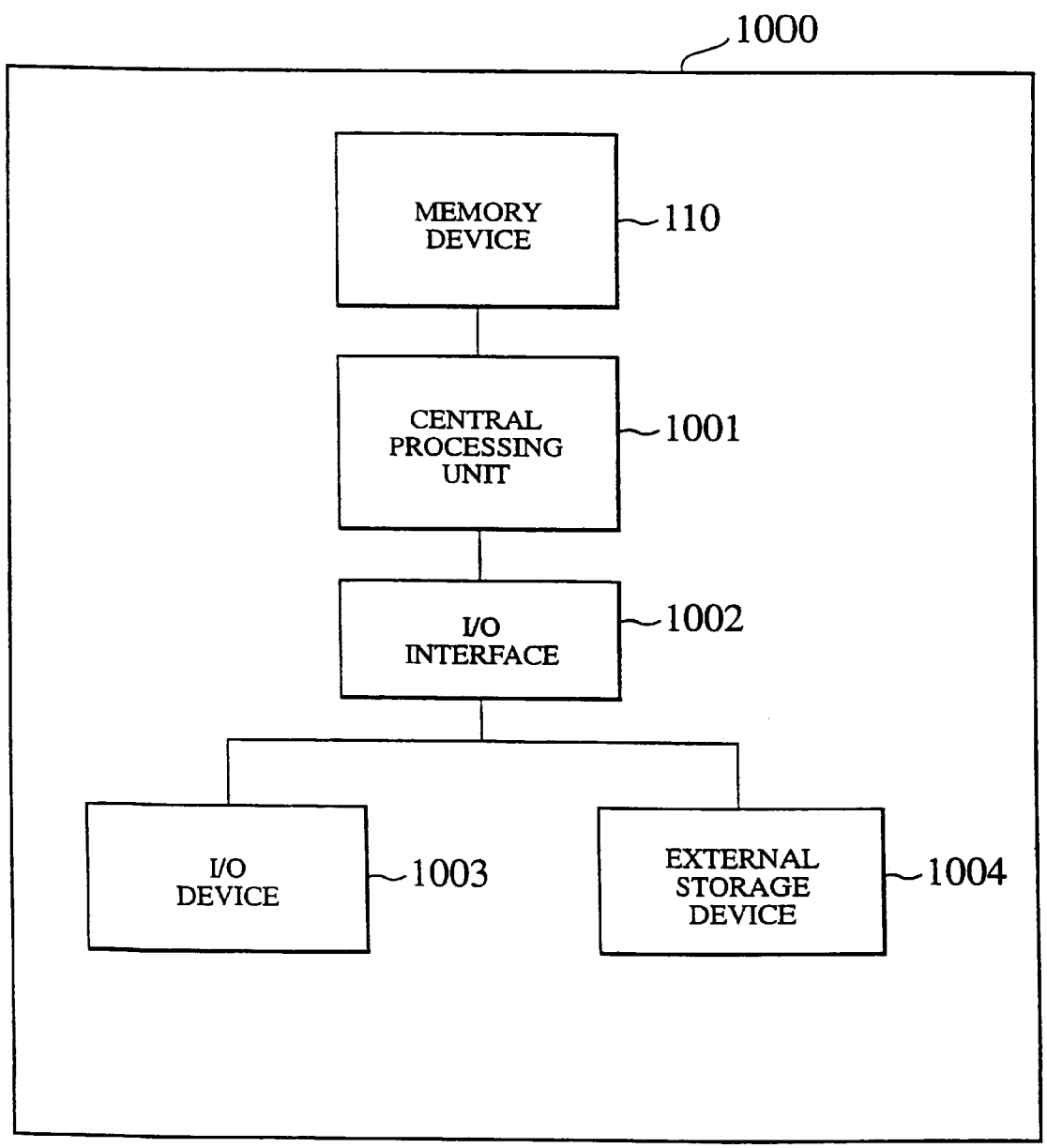
FIG. 16 is a block diagram showing an example of a system incorporating the semiconductor memory device according to the embodiments.

FIG. 15 shows an exemplary structure of a memory cell of a nonvolatile memory. Although in FIG. 16, a writing voltage of the memory cell using a floating gate is different from a reading voltage, test including checking of the operating margin can be carried out by controlling the writing word line potential and reading word line potential in the above described manner.

In summary, according to the present invention, by holding defective bit information (redundancy information) in the program array or the like of the nonvolatile memory, the redundancy recovery of the nonvolatile or volatile semiconductor memory device can be achieved without using the fuse. Therefore, all the aforementioned faults which may occur when the fuse is used can be eliminated, so that the operating margin can be checked each time when the system is started up. Consequently, the yield rate and reliability can be improved.

The above described respective semiconductor memory devices of the present invention may be incorporated in systems for conducting various processing using the memory device, for example, information processing system 1000 comprising a central processing unit (CPU) 1001, I/O interface 1002, input and output device 1003 and external storage device 1004. CPU 1001 carries out a desired processing using the above mentioned embodiments of the semiconductor memory device.

Further, according to the present invention, the defective information (redundancy information) of the memory cell is stored in the nonvolatile memory and the memory cell is tested at plural different access voltages each time when the device is started up. Then the redundancy can be achieved without use of the fuse. As a result, a processing step for introducing the fuse and a fuse meltdown step are eliminated, the overhead to the chip area is reduced and a test after fuse melt-down is not necessary, so that the yield rate can be raised.

On the other hand, with respect to the volatile memory device, because the fuse for storing the defective information of the memory cell is disposed in a pad formation region, the overhead of the area in the circuit formation region can be reduced.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A semiconductor memory device, comprising:
   a) a semiconductor substrate;
   b) a semiconductor memory region disposed in said semiconductor substrate and including:
      1) a plurality of semiconductor memory elements; and
      2) a redundant semiconductor memory element with which a defective memory element in the semiconductor memory elements is to be replaced;
   c) a fuse region containing a plurality of fuses configured to store redundancy information according to an address of the defective memory element into or from which data is unable to be written or read;
   d) a register circuit connected to said fuse region, said register circuit being configured to receive and hold said redundancy information stored in said fuse region based on whether or not a fuse provided in said fuse region is cut and to transmit said redundancy information; and
   e) a transfer circuit configured to transfer said redundancy information received from said register circuit to said semiconductor memory region serially so that the defective semiconductor memory element is replaced with the redundant semiconductor memory element;
   wherein each of said fuse region, said register circuit and said transfer circuit is disposed in an end portion or said semiconductor substrate.

2. The semiconductor memory device according to claim 1, wherein said fuse region concentrates in a single portion in said semiconductor substrate.

3. The semiconductor memory device according to claim 2, wherein said register circuit and said transfer circuit concentrate in a single portion in said semiconductor substrate.

4. The semiconductor memory device according to claim 1, wherein said register circuit and said transfer circuit concentrate in a single portion in said semiconductor substrate.

5. The semiconductor memory device according to claim 1, further comprising:
   a single signal wire configured to connect said transfer circuit and said semiconductor memory region.

6. The semiconductor memory device according to claim 1, further comprising:
   a plurality of pads disposed along neighborhood of the end portion of semiconductor substrate, said end portion having said fuse region, said register circuit and said transfer circuit.

7. The semiconductor memory device according to claim 1, wherein said transfer circuit is substantially disposed in a center portion of one side in said semiconductor substrate.

8. The semiconductor memory device according to claim 1, wherein both of said register circuit and said transfer circuit is disposed along one side in said semiconductor substrate.

9. The semiconductor memory device according to claim 1, wherein said transfer circuit is disposed substantially in a line with said plurality of pads disposed along neighborhood of the end portion of said semiconductor substrate.

10. The semiconductor memory device according to claim 1, wherein said semiconductor memory region includes a volatile memory.

11. The semiconductor memory device according to claim 1, wherein said fuse region is provided in a pad formation region out of said semiconductor memory region.

12. The semiconductor memory device according to claim 1, wherein said register circuit is provided in a pad formation region out of said semiconductor memory region.

13. The semiconductor memory device according to claim 1, wherein a number of fuses contained in said fuse region corresponds to a number of columns of the memory elements.

14. The semiconductor memory device according to claim 1, wherein:
   said register circuit electrically forms a determination whether or not said fuse is cut, and
   said redundancy information held by said register circuit is updated in accordance with the determination formed by said register circuit.

15. A system incorporating a semiconductor memory device, comprising:
   a) a semiconductor substrate;
   b) a semiconductor memory region disposed in said semiconductor substrate and including:
      1) a plurality of semiconductor memory elements; and
      2) a redundant semiconductor memory element with which a defective memory element in the semiconductor memory elements is to be replaced;

c) a fuse region configured to store redundancy information according to an address of the defective memory elements into or from which data is unable to be written or read;

d) a register circuit connected to said fuse region, said register circuit being configured to receive and hold said redundancy information stored in said fuse region based on whether or not a fuse provided in said fuse region is cut and to transmit said redundancy information;

e) a transfer circuit configured to transfer said redundancy information received from said register circuit to said semiconductor memory region serially so that the defective semiconductor memory element is replaced with the redundant semiconductor memory element;

f) a control circuit for replacing the defective memory element with the redundant memory element according to the redundancy information of the memory element held in said register circuit; and g) a processing unit for carrying out a desired processing using the semiconductor memory device;

wherein each of said fuse region, said register circuit and said transfer circuit is disposed in an end portion of said semiconductor substrate.

16. The system according to claim 15, wherein the control circuit includes a built-in self-repair circuit.

17. The system according to claim 15, wherein said fuse region concentrates in a single portion in said semiconductor substrate.

18. The system according to claim 15, wherein said register circuit and said transfer circuit concentrate in a single portion in said semiconductor substrate.

19. The system according to claim 15, further comprising:
a single signal wire configured to connect said transfer circuit and said semiconductor memory region.

20. The system according to claim 15, further comprising:
a plurality of pads disposed along neighborhood of the end portion of semiconductor substrate, said end portion having said fuse region, said register circuit and said transfer circuit.

* * * * *